United States Patent [19]
Akimoto et al.

[11] Patent Number: 6,004,047
[45] Date of Patent: Dec. 21, 1999

[54] METHOD OF AND APPARATUS FOR PROCESSING PHOTORESIST, METHOD OF EVALUATING PHOTORESIST FILM, AND PROCESSING APPARATUS USING THE EVALUATION METHOD

[75] Inventors: Masami Akimoto, Kumamoto; Kosuke Yoshihara, Kumamoto-ken; Yuji Fukuda, Tokyo, all of Japan

[73] Assignee: Tokyo Electron Limited, Tokyo, Japan

[21] Appl. No.: 09/034,335

[22] Filed: Mar. 4, 1998

[30] Foreign Application Priority Data

Mar. 5, 1997 [JP] Japan ................................. 9-069255
May 30, 1997 [JP] Japan ................................. 9-142739

[51] Int. Cl.$^6$ ....................................................... G03D 5/00
[52] U.S. Cl. ................................. 396/604; 396/611; 118/52
[58] Field of Search ................................. 396/604, 611, 396/627; 118/52, 666, 712, 665; 427/335, 385.5

[56] References Cited

U.S. PATENT DOCUMENTS 5,143,552   9/1992   Moriyama .......................... 118/666
5,633,040   5/1997   Toshima et al. ..................... 427/335
5,939,130   8/1999   Shiraishi et al. ..................... 118/52

FOREIGN PATENT DOCUMENTS 0 595 749    5/1994   European Pat. Off. .
  810663    12/1997   European Pat. Off. .
2-234417    9/1990   Japan .
4-164314    6/1992   Japan .
9-213600    8/1997   Japan .

OTHER PUBLICATIONS

Patent Abstract of Japan, vol. 13, No. 496 (E–843), Nov. 9, 1989, JP–A–1–200623, Aug. 11, 1989.
Patent Abstract of Japan, vol. 13, No. 507 (E–845), Nov. 14, 1989, JP–A–1–204420, Aug. 17, 1989.

*Primary Examiner*—D. Rutledge
*Attorney, Agent, or Firm*—Oblon, Spivak, McClelland, Maier & Neustadt, P.C.

[57] ABSTRACT

A resist processing method includes setting a substrate at a specific temperature, forming a resist film on the substrate by applying a resist solution onto the substrate while turning the substrate set at the specific temperature, heating the substrate on which the resist film has been formed, cooling the substrate a specific temperature after the heating process, wherein the thickness of the resist film on the substrate is measured between the heating process and the cooling process.

22 Claims, 14 Drawing Sheets

METHOD OF AND APPARATUS FOR PROCESSING PHOTORESIST, METHOD OF EVALUATING PHOTORESIST FILM, AND PROCESSING APPARATUS USING THE EVALUATION METHOD

BACKGROUND OF THE INVENTION

This invention relates to a method of and a system for subjecting a substrate to photoresist processing and a method of evaluating a photoresist film, and more particularly to a method of evaluating a resist film made of a chemically amplified photoresist and a processing apparatus using the same.

In the photoresist processing step in the semiconductor device manufacturing process, a photoresist film is formed by applying a photoresist solution onto the surface of a substrate, such as a semiconductor wafer (hereinafter, referred to as a wafer), exposing the photoresist-coated surface through a specific pattern, and then developing the exposed surface with a developing solution. In such a series of processes, a photoresist processing system has been used.

The photoresist processing system includes processing units which separately carry out the following processes: an adhesion process to improve the fixation of photoresist, a coating process to apply a photoresist solution, a heating process to harden the photoresist film by putting the photoresist-coated substrate in an atmosphere of a specific temperature, a heating process to put the exposed substrate in an atmosphere of a specific temperature, and a developing process to supply a developing solution to the exposed substrate for development. The photoresist processing system uses a transfer mechanism, such as a transfer arm, to load and unload a wafer, or substrate, into and from each of the processing units.

A photoresist film formed on the wafer is required to have not only a desired thickness but also a good uniformity of thickness. To meet these requirements, it is necessary to measure the thickness of the photoresist film formed in the photoresist processing system. A conventional method of measuring the thickness of a photoresist film is carried out according to the following procedure.

First, a photoresist film is formed on a dummy wafer in the photoresist processing system. Thereafter, the dummy wafer is taken out of the photoresist processing system by a carrier. The thickness of the photoresist film on the dummy wafer is then measured with a thickness measuring instrument provided outside the system. The humidity in a photoresist coating unit and the rotational speed of the wafer in the photoresist coating unit in the photoresist processing system are adjusted on the basis of the result of the measurement so that the photoresist film may have a desired film thickness with good uniformity.

When the dummy wafer is taken out of the photoresist processing system and the film thickness is measured, it is necessary to stop the photoresist processing system temporarily. In addition, the thickness of the photoresist film has to be measured periodically, such as lot by lot. The temporary stop and the periodic measurement result in a decrease in the throughput. Since the environment in which the photoresist processing system resumes the operation after the measurement of the thickness of the photoresist film is not identical with the system environment at the time when the photoresist film was formed on the dummy wafer, there may be a case where the result of measuring the film thickness cannot be applied to the adjustment of the resist film forming conditions without any modification.

Use of chemically amplified photoresist is suitable for the manufacture of extra large scale integration in terms of sensitivity and resolution. When a photoresist film is made of chemically amplified photoresist, there arises a problem: the thickness of the photoresist film changes as time passes. For example, suppose one hundred wafers are coated with photoresist consecutively and after the formation of the photoresist film, the film thickness of each of the wafers is measured one by one in the order in which they have been coated with photoresist. During the time from when the film thickness of the first wafer is measured until the film thickness of the hundredth wafer is measured, the time required to measure 99 wafers has elapsed. The film thickness data varies as time passes. For example, in a case where a chemically amplified photoresist is used whose film thickness decreases by about 10 angstroms per hour with respect to the film thickness of 8000 angstroms immediately after the coating, if one hundred wafers are coated with photoresist consecutively and then the film thickness of each of the wafers is measured and it takes five hours to measure the hundred wafers, the thickness of the hundredth resist film will be thinner than that of the first resist film by about 50 angstroms.

As a consequence, even if there is nothing wrong with the coating process, the film thickness will decreases as time elapses. An abnormality in the coating process would cause the thickness of the resist film to vary, resulting in a gradual decrease in the thickness of the photoresist film subsequently formed. Because of this, an examination of the relationship between the elapsed times and the film thicknesses in the order of measuring the film thicknesses does not help make a determination whether the photoresist film is in a good condition or its film thickness has changed because an abnormality has occurred.

As described above, when a photoresist film is made of a chemically amplified resist whose film thickness changes as time elapses, it is difficult to determine from a simple measurement of the thickness of the photoresist film whether or not the film thickness itself has changed. This causes the problem of being unable to make an accurate determination whether or not there is any abnormality in the coating process or in the photoresist film.

BRIEF SUMMARY OF THE INVENTION

An object of the present invention is to provide a photoresist processing method and a photoresist processing system which measure the thickness of a photoresist film on a substrate without taking the substrate, such as a wafer, out of the photoresist processing system, enable the adjustment of the photoresist film forming conditions in the photoresist processing system on the basis of the measurement, and thereby achieve a great throughput.

Another object of the present invention is to provide a film thickness evaluation method capable of accurately determining whether or not there is any abnormality in the coating process or in the thickness of the formed photoresist film when a photoresist film is formed on a wafer using a material whose film thickness varies with elapsed time as a chemically amplified resist does, and a processing apparatus using the film thickness evaluation method.

According to a first aspect of the present invention, there is provided a resist processing method in a resist processing system, comprising a first step of setting a substrate at a specific temperature, a second step of forming a resist film on the substrate by applying a resist solution onto the substrate while turning the substrate set at the specific temperature, a third step of heating the substrate on which the resist film has been formed, a fourth step of cooling the heated substrate to a specific temperature, and a step of measuring the thickness of the resist film on the substrate between the third step and the fourth step in the resist processing system.

The thickness of the resist film on the substrate may be measured after the fourth step. With this method, the thickness of the resist film on the substrate can be measured without taking the substrate out of the resist processing system.

When the result of measuring the thickness of the resist film has shown that the desired film thickness has not been reached or that the uniformity of the film thickness is outside the permitted range, at least the humidity in the resist coating unit, the rotational speed of the substrate in the resist coating unit, and either the temperature of the substrate or the temperature of the resist solution in the first step are adjusted.

With this method, because the thickness of the resist film is measured inside the resist processing system, it is not necessary to stop the resist processing system during the measurement of the film thickness, helping keep the environment within the resist processing system constant. This makes it possible to directly use the result obtained by measuring the thickness of the resist film, facilitating the adjustment of the resist forming conditions.

The thickness of the resist film may be measured in a film thickness measurement stage provided in the resist processing system. The thickness may be measured while the transfer mechanism in the resist processing system is holding the substrate in place. This would eliminate the installation space for the film thickness measurement stage, helping make the resist processing system more compact. Additionally, with the approach, there would be no need to perform the process of transferring the substrate to the film thickness measurement stage.

The thickness of the resist film may be measured on a test substrate provided in the resist processing system. The test substrate may be held in a container, such as a carrier, in the resist processing system, and be taken out of the container at the time of measuring the thickness of the resist film. At that time, the resist film on the test substrate whose film thickness has been measured may be washed out at the resist coating unit. The test substrate from which the resist film has been washed may be stored in the carrier within the processing system for subsequent resist film thickness testing. This enables the test substrate to be used more than once.

According to a second aspect of the present invention, there is provided a resist processing system comprising a resist coating unit for forming a resist film on a substrate by applying a resist solution onto the substrate while turning the substrate, a heating unit for heating the substrate, a transfer mechanism for holding and transferring the substrate, and a film thickness measuring instrument provided above a load/unload slot of the heating unit to measure the thickness of the resist film formed on the substrate.

In general, after being coated with a resist solution, the substrate goes into the heating process to harden the resist solution. With the film thickness measuring instrument above the heating unit, the heated substrate never fails to pass through or near a film thickness measuring point when being taken out of the heating unit. Therefore, the thickness of the resist film can be measured immediately after the heating process at the heating unit without unnecessary movement of the substrate, resulting in an improvement in the throughput.

According to a third aspect of the present invention, there is provided a resist processing system comprising a resist coating unit for forming a resist film on a substrate by applying a resist solution onto the substrate while turning the substrate; heating units for heating the substrate to a first temperature, temperature adjusting units having the function of cooling at least the substrate to a second temperature, a transfer mechanism for holding and transferring the substrate, and a film thickness measuring instrument which is provided above load/unload slots of at least either the heating units or the temperature adjusting units, the heating units and the temperature adjusting units being laid one on top of another, and which measures the thickness of the resist film formed on the substrate.

Here, cooling includes both forced cooling by the circulation of a refrigerant and natural cooling by ambient temperature. With this configuration, after the heating process at the heating unit or after the temperature adjustment at the temperature adjusting unit, the thickness of the resist film can be measured immediately without unnecessary movement of the substrate, leading to an improvement in the throughput.

An instrument for measuring the thickness of the resist film may be provided above the transfer path of the substrate. With this configuration, the thickness of the resist film can be measured in the course of the transfer of the substrate by the transfer mechanism.

According to a fourth aspect of the present invention, there is provided a film thickness evaluation method comprising the steps of storing data on the variation of the thickness of a chemically amplified resist film formed on a substrate with elapsed time, measuring the thickness of the chemically amplified resist film formed on the substrate, and correcting the value of the measured film thickness on the basis of the stored data.

In the film thickness evaluation method, the value of the thickness of the chemically amplified resist film formed on the substrate is corrected on the basis of data on the variation of the thickness of the resist film with the elapsed time. This makes it possible to grasp an accurate value of the film thickness, regardless of the elapsed time.

In the film thickness evaluation method, it is determined whether or not the film thickness corrected on the basis of data on the variation of the chemically amplified resist film formed on the substrate with the elapsed time is outside a permitted range previously determined on the basis of data. If the corrected film thickness is outside the permitted range, an alarm will be given. This enables the operator to know the occurrence of an abnormality in the formed resist film accurately and quickly.

In the film thickness evaluation method, the thickness of the chemically amplified resist film formed on the resist film is first measured. On the basis of the value of the measured film thickness, data used for correction is compensated for. This makes it possible to grasp an accurate value of the film thickness, regardless of the elapsed time.

According to a fifth aspect of the present invention, there is provided a processing apparatus comprising means for forming a chemically amplified resist film on a substrate, means for storing data on the variation of the thickness of the chemically amplified resist film formed on the substrate with elapsed time, means for measuring the thickness of the chemically amplified resist film formed on the substrate, and means for correcting the value of the measured film thickness on the basis of the stored data, wherein these means are integrated into a single structure.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
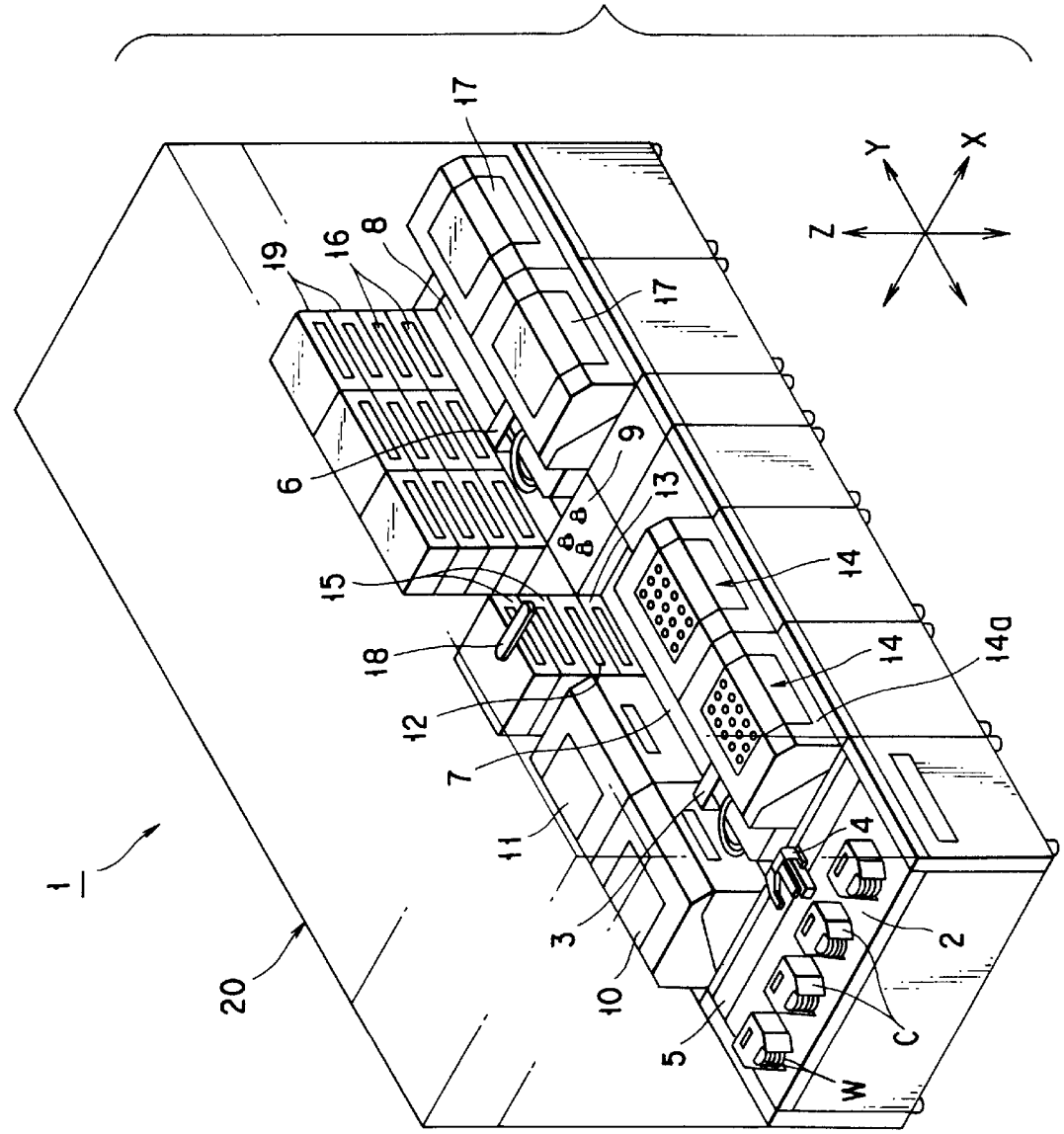
FIG. 1 is a perspective view of a coating/development system according to an embodiment of the present invention.

FIG. 1 shows a coating/development system 1 provided with various processing units which separately perform the following processes: the process of cleaning a wafer W, an adhesion process for improving the fixation of resist, the process of applying a resist solution, heating processes following these processes, cooling processes for cooling the wafer W to a specific temperature after the heating processes, and a developing process and a heating process after exposure.

The coating/development system 1 includes a table section 2 on which cassettes C are arranged in line and a transfer mechanism 4. Each of the cassettes C is a container for housing wafers W. The transfer mechanism 4 takes a wafer W out of the cassette C on the table section 2 and conveys it to a transfer arm 3 acting as a transfer unit. The transfer mechanism 4 is designed to move freely on a transfer path 5 provided in the direction in which the cassettes C are arranged in line. The various processing units that perform specific processes on the wafer W are arranged on both sides of transfer paths 7 and 8 over which two transfer arms 3 and 6 move respectively. A substrate table section 9 is provided between the transfer path 7 and transfer path 8.

The coating/development system 1 further includes a brushing unit 10 for brushing the wafer W while turning the wafer W to clean the surface of the wafer W taken out of the cassette C, a water cleaning unit 11 for subjecting the wafer W to high-pressure jet spray cleaning, an adhesion processing unit 12 for improving the fixation of resist by subjecting the surface of the wafer W to an adhesion process, cooling units 13 and 16 for cooling the wafer W to specific temperatures, a resist coating unit 14 for coating the surface of the turning wafer W with a resist solution, heating units 15 and 19 for heating the resist-solution-coated wafer W or the exposed wafer W, and a developing unit 17 for developing the exposed wafer W by supplying a developing solution to the wafer's surface, while turning the wafer W. On the top of the heating unit 15, a film-thickness measuring instrument 18 is provided. The processes carried out by these processing units are put together to some extent. Integrating the processing units into suitable processing unit groups helps reduce the installation space and increase the processing efficiency. Two transfer arms 3 and 6 are used to load and unload the wafer W into and from the processing units. The processing units and related component parts are provided within a casing 20.

Figure 2:
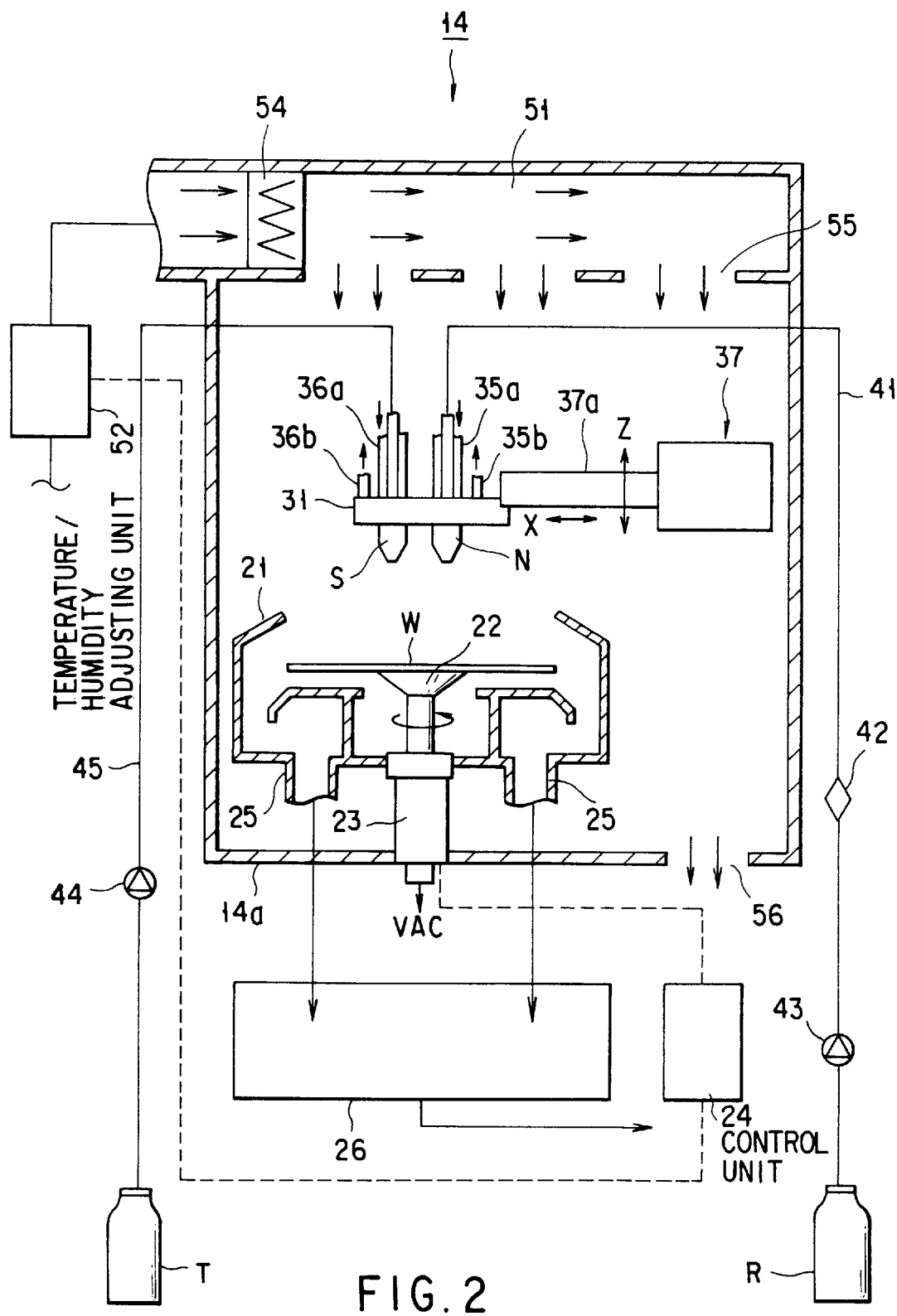
FIG. 2 is a schematic representation of the configuration of a resist coating unit built in the coating system of FIG. 1.

The resist coating unit 14 is housed in the casing 14a and is constructed as shown in FIG. 2. Specifically, a spin chuck 22 for holding the wafer W horizontally by vacuum adhesion is provided in a cup 21 for housing the waver W. The spin chuck 22 is rotated freely by a driving unit 23, such as a pulse motor, provided below the cup 21. Its rotational speed can be controlled by a control unit 24. An atmosphere in the cup 21 is exhausted from the center of the bottom of the cup 21 by an exhausting unit (not shown), such as a pump, provided outside the system. A resist solution and solvent are discharged to a drain tank 26 below the cup 21 through a drain pipe 25 on the bottom of the cup 21.

The resist solution is supplied to the wafer W from a resist nozzle N. The nozzle N is held in a nozzle holder 31. The resist solution is supplied to the resist nozzle N from a resist solution supply source R, such as a resist solution tank located outside, through a resist solution feed tube 41. The resist solution feed tube 41 has a filter 42 inserted in the middle to remove impurities, including particles. The supplying of the resist solution is effected by a feed machine 43, such as a bellows pump, which supplies a constant amount of resist solution.

The nozzle holder 31 has an outgoing path 35a and a return path 35b both having tubes for circulating temperature adjusting fluid. The resist solution flowing in the resist solution feed tube 41 is kept at a constant temperature and the supplied resist solution is always at a specific temperature by circulating the temperature adjusting fluid externally supplied via the outgoing path 35a to the return path 35b.

On the other hand, the solvent from the solvent supply source T, such as a solvent tank, is supplied to a solvent nozzle S by a feed machine 44, such as a pump, through a solvent tube 45. The nozzle holder 31 further has an outgoing path 36a and a return path 36b composed of tubes for circulating temperature adjusting fluid to keep the solvent flowing through the solvent tube 45 at a specific temperature.

The nozzle holder 31 holding the resist solution nozzle N and the solvent nozzle S in a pair is moved by a scanning arm 37a of a scanning mechanism 37 to a specific position on the wafer W. The scanning arm 37a is designed to make three dimensional movements, that is, to be movable in the X, Y, and Z directions.

At the top of the inside of the casing 14a forming the outer wall of the resist coating unit 14, a chamber 51 is formed. The air whose temperature and humidity have been adjusted at a temperature/humidity adjusting unit 52 is supplied to the chamber 51 via a high-performance filter 54. The temperature/humidity adjusting unit 52 is controlled by the control unit 24. A cleaned down-flow air is supplied from an outlet 55 of the chamber 51 into the cup 21. The atmosphere in the resist coating unit 14 is exhausted through a vent 56 provided separately.

Figure 3:
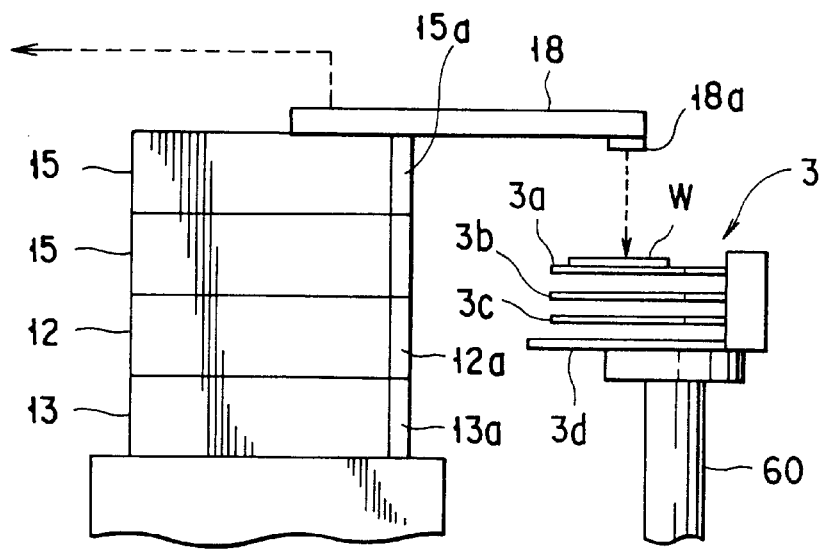
FIG. 3 is a side view of a resist film thickness measuring unit according to the embodiment.
Figure 4:
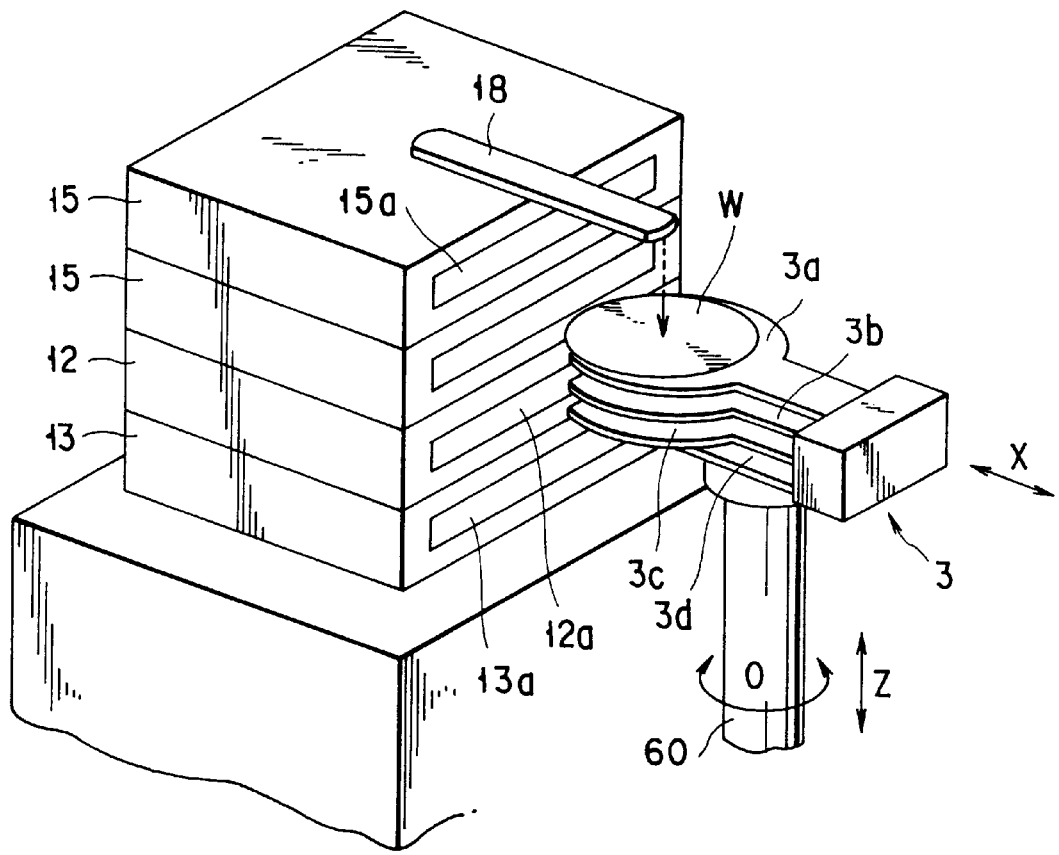
FIG. 4 is a perspective view of the resist film thickness measuring unit according to the embodiment.

The cooling unit 13, adhesion processing unit 12, and heating unit 15 are laid one on top of another in that order as shown in FIGS. 3 and 4. Specifically, at the bottom, the cooling unit 13 for cooling the wafer to a specific temperature is provided. On the cooling unit 13, the adhesion processing unit 12 for improving the fixation of resist by subjecting the surface of the wafer W to the adhesion process is provided. On the adhesion processing unit 12, there is provided the heating unit 15 for heating the wafer W coated with the resist solution at the resist coating unit 14 and hardening the coated resist solution.

The load/unload slots 12a, 13a, and 15a for wafers W of the adhesion processing unit 12, cooling unit 13, and heating unit 15 are located at the front of the respective processing units, that is, on the side of the transfer path 7. The transfer arm 3 is provided in the position facing the load/unload slots 12a, 13a, and 15a. The transfer arm 3 is provided with three tweezers 3a, 3b, and 3c arranged vertically. These three tweezers 3a, 3b, and 3c hold the wafers W directly and slide along the board 3d, or in the direction of X. The board 3d is moved up and down freely, or in the direction of Z, by an elevator post 60 supporting the transfer arm 3. This allows the wafers W held by the tweezers 3a, 3b, and 3c of the transfer arm 3 to be loaded and unloaded freely into and from the adhesion processing unit 13, cooling unit 13, and heating unit 15. The transfer arm 3 can rotate freely in the direction of θ by a suitable driving mechanism.

As shown in FIGS. 3 and 4, the film thickness measuring instrument 18 is provided above the load/unload slot 15a of the heating unit 15. An optical sensor head 18a is provided at the tip of the film thickness measuring instrument 18. The sensor head 18a emits a light beam of a suitable frequency downward, or toward the surface of the wafer W. The emitted light beam strike the surface of the wafer W and produce the reflected light. On the basis of the reflected light, the thickness of the resist film formed on the wafer is measured. The measurement data is sent to the control unit 24 and is used to correct the resist film forming conditions. This enable the thickness of the resist film to be adjusted by adjusting the rotational speed of the wafer according to the measurement data. Specifically, the measurement data is inputted to the control unit 24. The control unit 24 determines the rotational speed of the wafer on the basis of the measured film thickness and the desired film thickness and sends data on the determined rotational speed to the driving mechanism 23. Then, the driving mechanism 23 turns the wafer according to the rotational speed data. This causes the resist solution supplied to the wafer to spread according to the rotational speed of the wafer, thereby producing a resist film with a desired thickness on the wafer.

The coating/development system 1 according to the embodiment has the configuration described above. In the system, when a transfer robot (not shown) places a carrier C housing a substrate for measuring the thickness of the resist film, i.e., a dummy wafer W on the table 2, the transfer mechanism 4 takes the wafer W out of the carrier C and hands it over to the transfer arm 3. The transfer arm 3 conveys the wafer W to the brushing unit 10 and water cleaning unit 11 and loads it into these units. The brushing unit 10 brushes the wafer and the water cleaning unit 11 cleans the wafer W with water. Thereafter, the transfer arm 3 takes out the waver W, conveys it to the adhesion processing unit 12, and loads it into the unit 12. The adhesion processing unit 12 subjects the surface of the wafer W to the adhesion process. Then, the transfer arm 3 loads the wafer W into the cooling unit 13, which cools the wafer W to a specific temperature. Thereafter, the transfer arm 3 carries the wafer W to the resist coating unit 14, which applies a resist solution to the wafer W while turning the wafer W. After the resist coating process, the transfer arm 3 unloads the wafer W from the resist coating unit 14 and transports it to the heating unit 15. The heating unit 15 subjects the wafer W to a specific heating process, which makes the resist solution harden, thereby forming a resist film on the wafer W.

After the heating process, the transfer arm 3 unloads the wafer W from the heating unit 15. At the same time that the wafer W is unloaded, the film thickness measuring instrument 18 provided above the load/unload slot 15a of the heating unit 15 measures the thickness of the resist film. The position where the thickness of the resist film is to be measured can be set arbitrarily as long as the position is on the X axis when the wafer W is unloaded from the heating unit 15. The number of measurement positions is not limited in the present invention. In the embodiment, the number of measurement positions is assumed to be five. If the measuring distance, or the distance between the film thickness instrument 18 and the wafer W is set at the distance between the instrument 18 and the surface of the wafer W at the time when the wafer W is unloaded from the load/unload slot 15a of the heating unit 15, this will make it unnecessary for the transfer arm 3 to move in the direction of Z during the measurement of the film thickness, simplifying the measuring process. When the measuring distance cannot be adjusted on the surface of the unloaded wafer W, the transfer arm 3 pulls the heated wafer W sufficiently out of the heating unit 15 in the direction of X and then raises the wafer in the direction of Z until it has entered the film thickness measuring distance range. Then, the thickness of the resist film is measured, while the transfer arm is moving the wafer again in the direction of X.

With the coating/development system 1 according to the embodiment, the thickness of the resist film can be measured without conveying the wafer W outside the coating/ development system 1. Furthermore, it is not necessary to stop the coating/development system 1 for the measurement of the film thickness. As a result, the throughput is improved. Because the thickness of the resist film is measured inside the coating/development system, the environment inside the system is kept constant, which makes it possible to use the results of measuring the thickness of the resist film, thus facilitating the adjustment of the resist film forming conditions.

Because the thickness of the resist film formed on the wafer W is measured while the transfer arm 3 is holding the wafer in place, a particular space for the wafer W during the measurement of the film thickness is eliminated. This makes it possible to add the film thickness measuring process without increasing the overall size of the coating/development system 1. In addition, it is not necessary to add a special transfer process for measuring the thickness of the resist film on the wafer W. Furthermore, because a conventional film thickness measuring instrument located outside the coating/development system 1 is unnecessary, the floor space of the clean room is decreased.

Figure 5:
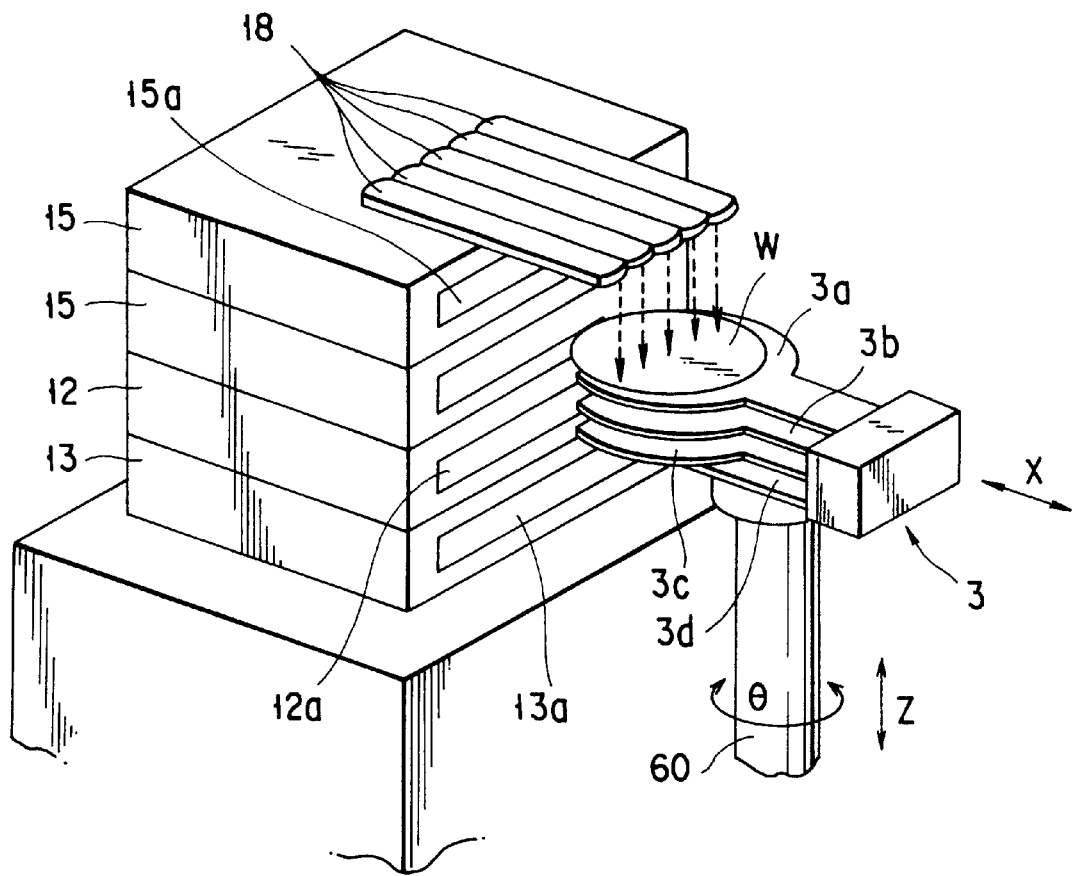
FIG. 5 is a perspective view of the resist film thickness measuring unit according to another embodiment of the present invention.

In the embodiment, the film thickness measuring instrument 18 is provided above the load/unload slot 15 of the heating unit 15 and the thickness of the resist film is measured at five positions in line in the X direction of X in which the wafer is unloaded from the heating unit 15. In this type of measurement, the thickness of the resist film on the wafer W is generally measured at about 25 positions or points. As shown in FIG. 5, five film thickness measuring instruments 18 may be provided side by side above the load/unload slot 15a of the heating unit 15. With this arrangement, the film thicknesses at 5×5=25 positions can be measured by just carrying out the same measuring process as described above. Moreover, turning the transfer arm in the direction of θ enables the thickness of the resist film to be measured at more places, providing a more detailed result of measuring the film thickness.

The thickness of the resist film on the wafer W may be measured after the cooling process at the cooling unit 13 following the heating process, instead of after the heating process at the heating unit 15. After the heating process, the wafer W subjected to the cooling process is unloaded by the transfer arm 3 from the cooling unit 13. At that time, the thickness of the resist film may be measured by the film thickness measuring instrument 18 provided above the load/unload slot 15a of the heating unit 15 at the same time that the wafer W is unloaded. Furthermore, the film thickness measuring instrument 18 may be provided above the transfer path 7 and transfer path 8 (not shown) and the thickness of the resist film may be measured while the transfer arm 3 is conveying the wafer W.

After the thickness of the resist film has been measured, the transfer arm 3 loads the wafer W again into the resist coating unit 14, which supplies a solvent from a solvent nozzle S to the wafer W while turning the wafer, thereby removing the resist film. The resist-film-removed wafer W may be returned by the transfer mechanism 4 to the carrier C and be stored until the thickness of the next resist film is measured. This enables the film thickness measuring wafer W to be used more than once, which makes it unnecessary to prepare a wafer each time the thickness of the resist film is measured, leading to cost reduction. In addition to removing the resist film formed on the wafer W at the resist coating unit, it may be removed using a resist stripping solvent at a resist stripping unit (not shown).

Figure 6:
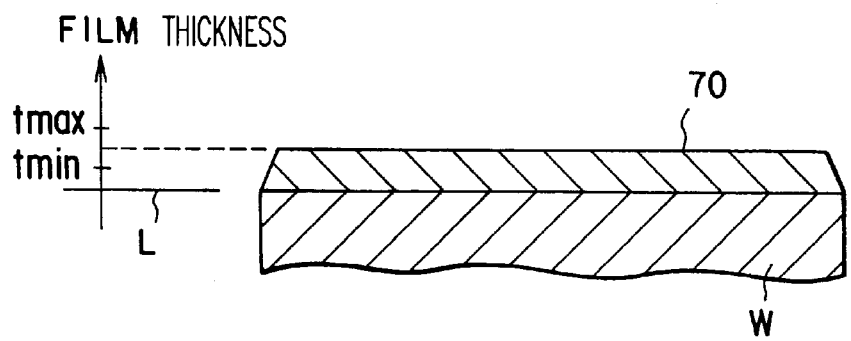
FIG. 6 is a sectional view of a resist film formed on a wafer using the coating/development system of FIG. 1.
Figure 7:
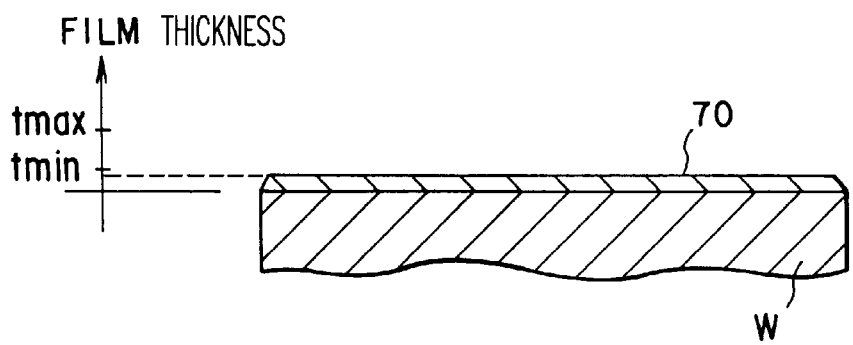
FIG. 7 a sectional view of a resist film formed on a wafer using the coating/development system of FIG. 1.
Figure 8:
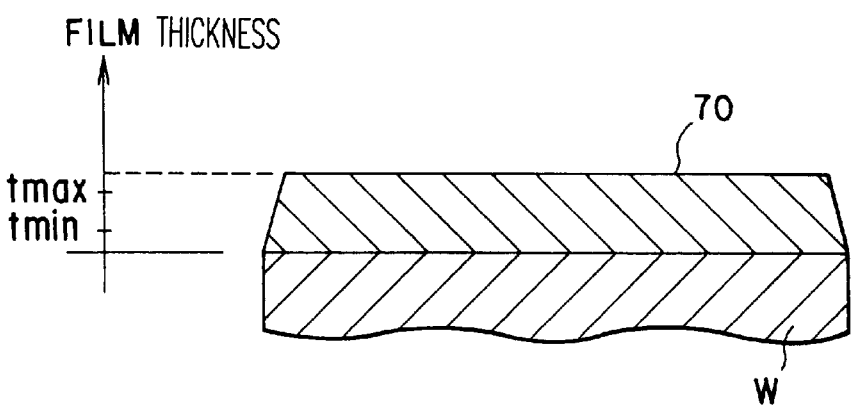
FIG. 8 is a sectional view of a resist film formed on a wafer using the coating/development system of FIG. 1.
Figure 9:
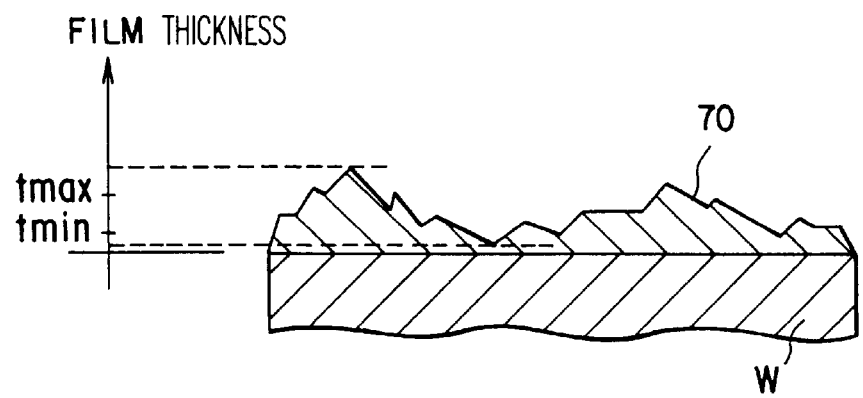
FIG. 9 its a sectional view of a resist film formed on a wafer using the coating/development system of FIG. 1.

When the result of measuring the thickness of the resist film 70 has shown that the thickness of the resist film formed on the wafer W is within the permitted range from the largest film thickness tmax to the smallest film thickness tmin as shown in FIG. 6, the resist film forming conditions in the coating/development system need not be adjusted. When the resist film 70 has exceeded the largest film thickness tmax as shown in FIG. 7, or when the resist film 70 has dropped below the smallest film thickness tmin as shown in FIG. 8, at least either the temperature of the wafer immediately before the resist solution is supplied or the temperature of the resist solution supplied from the resist solution nozzle N is adjusted by suitable means at a later stage. This provides the conditions for forming a resist film of a desired thickness.

On the other hand, when the resist film 70 on the wafer W is thicker than the upper limit of the permitted range at places on line L and is thinner than the lower limit of the permitted range at other places, at least either the number of revolutions of the wafer W is changed during the application of resist solution or the humidity in the resist coating unit is adjusted to improve the uniformity of the film thickness. Thereafter, as the need arises, at least the temperature of the wafer immediately before the resist solution is applied or the temperature of the resist solution supplied from the resist solution nozzle is adjusted, as when the film thickness has exceeded the largest film thickness tmax or when the film thickness has dropped below the smallest film thickness tmin. This provides the conditions for forming a resist film with a good uniformity of the film thickness.

The temperature of the wafer immediately before the resist solution is applied can be adjusted by the cooling unit 13. The temperature of the resist solution supplied from the resist solution nozzle N can be controlled by the temperature adjusting fluid supplied to the nozzle holder 31. The number of revolutions of the wafer W during the application of the resist solution can be adjusted by the driving mechanism 23, such as a pulse motor, which is controlled by the control unit 24. The humidity in the resist coating unit 14 can be adjusted by the humidity adjusting unit 52 controlled by the control unit 24.

After the coating/development system 1 has been adjusted, the thickness of the resist film may be measured again to verify the contents of the adjustment. At that time, the film thickness measurement wafer W may be used. The film thickness measurement wafer W has been used in the preceding measurement of the resist film and stored in the cassette C. The measurement of the resist film's thickness and the adjustment of the coating/development system on the basis of the result of measurement may be repeated until the thickness of the resist film and the uniformity of the film thickness have reached the permitted ranges.

While in the embodiment, the substrate has been a wafer, it may be another suitable substrate. For instance, it may be an LCD glass substrate.

With the method of processing resist according to the embodiment, the thickness of the resist film can be measured without conveying the substrate outside the coating/development system. This eliminates the step of conveying the substrate outside the resist processing system for the measurement of the resist film's thickness. Furthermore, it is not necessary to stop the resist processing system for the measurement of the film thickness. As a result, the throughput is improved. Because the thickness of the resist film is measured inside the resist processing system, it is possible to directly use the results of measuring the thickness of the resist film, thus facilitating the adjustment of the resist film forming conditions. Because the thickness of the resist film is measured while the transfer mechanism is holding the substrate in place, a particular space for the substrate during the measurement of the resist film's thickness is eliminated. This makes it possible to add the film thickness measuring process without increasing the overall size of the resist processing system. In addition, it is not necessary to add a special transfer process for measuring the thickness of the resist film on the substrate. Furthermore, the measurement of the thickness of the test substrate held in the resist processing system makes it unnecessary to load a measurement substrate into the resist processing system each time the thickness of the resist film is measured. This improves the operating efficiency of the resist processing system. By washing out the resist film on the test substrate whose film thickness has been measured, the measurement substrate can be used more than once, which makes it unnecessary to prepare substrates each time the thickness of the resist film is measured, leading to cost reduction.

Furthermore, when a film thickness measuring instrument for measuring the thickness of the resist film formed on the substrate is provided above the load/unload slot of the heating unit, the need of a conventional film thickness measuring instrument located outside the coating/development system 1 is eliminated, thus helping to decrease the floor space of the clean room.

As another embodiment, a method of evaluating a resist film formed on a semiconductor wafer, particularly a method of evaluating the thickness of a resist film made of chemically amplified resist, and a processing apparatus using the method will be explained. The evaluation method and processing apparatus are applicable to a lateral type coating/development system as described above. In the present embodiment, explanation will be given, provided that they have been applied to a vertical type coating/development system.

The vertical type coating/development system will be described by reference to FIGS. 10 to 13.

The processing system comprises a cassette station 110, a processing station 112, and an interface station 114. In the system, these component parts are connected to each other to form an integral structure. The cassette station 110 loads and unloads semiconductor wafers W into and from the system in units of 25 wafers housed in a wafer cassette CR. The cassette station 110 also loads and unloads a semiconductor waver W into or from the wafer cassette CR. The processing station 112 comprises various processing units of the sheeting type that perform specific processes on wafers W one by one in the coating and developing processes. The processing units are provided in specific positions in a multistage manner. The interface section 114 gives and receives a semiconductor wafer W to and from an exposure unit (not shown) adjacent to the processing station 112.

Figure 10:
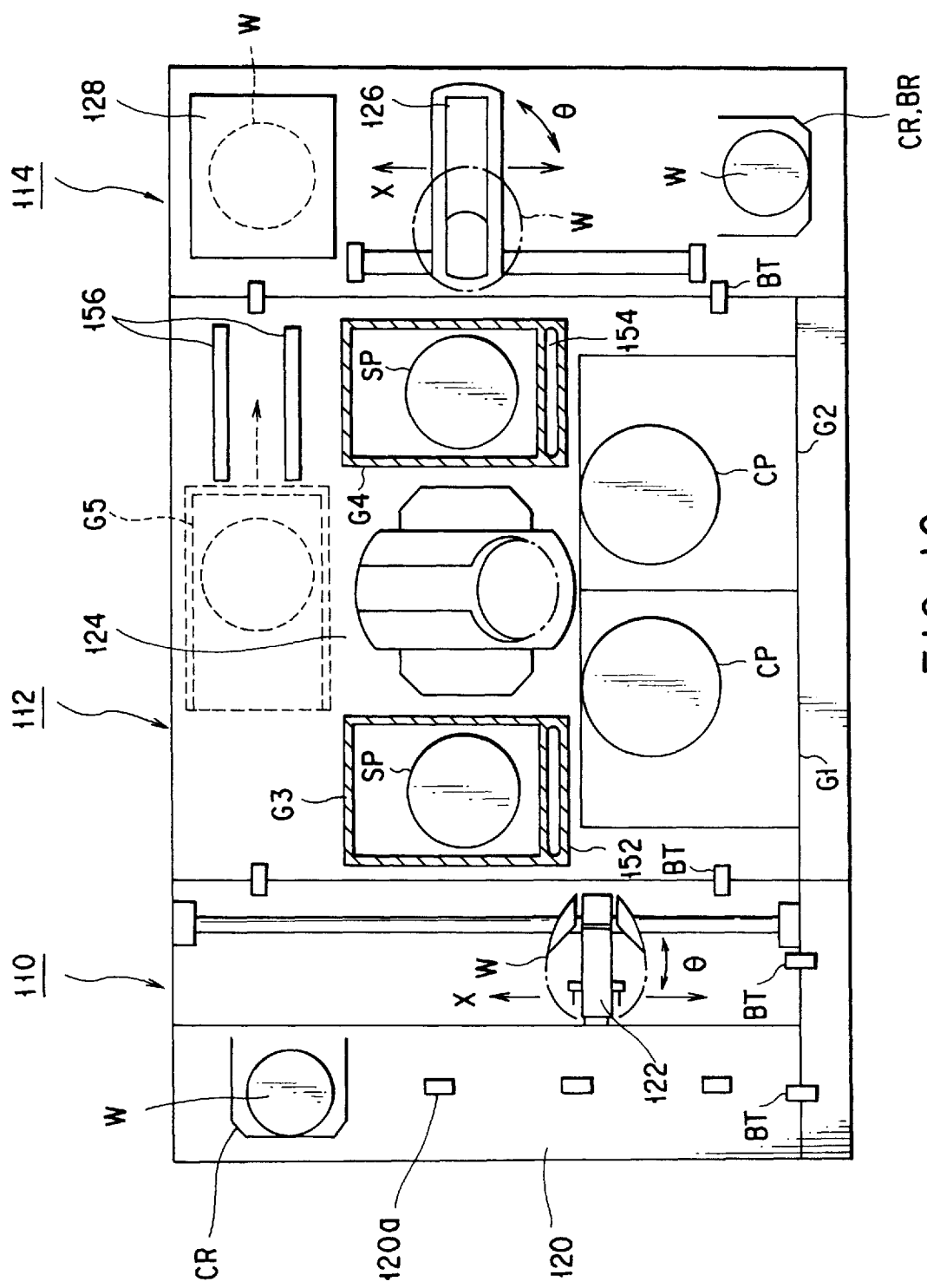
FIG. 10 is a plan view of the entire coating/development system including a resist coating system according to the present invention.

In the cassette station 110, more than one wafer cassette C (e.g., four cassettes) is placed in a line on projections 120a on a cassette table 120 in the direction of X, with the wafer load/unload slot of each wafer cassette facing the processing station 112 as shown in FIG. 10. A wafer transfer machine 122 can move in the direction of cassette arrangement (i.e., in the direction of X) and in the direction in which the wafers are arranged within the wafer cassette CR (i.e., in the direction of Z). The wafer transfer machine 122 selectively accesses one of the wafer cassettes CR. The wafer transfer machine 122 is designed to rotate in the direction of θ. The transfer machine is also capable of accessing an alignment unit (ALIM) and an extension unit (EXT) belonging to the multistage unit section of a third processing unit group G3 on the processing station 112's side, as explained later. The processing station 112 has a main wafer transfer machine 124 of the vertical transfer type in its center. Around the main wafer transfer machine, all of the processing units are arranged in a group or groups. Each group is made up of processing units arranged in a multistage manner.

In the system of the embodiment, five processing unit groups G1, G2, G3, G4, and G5 are arranged in a multistage manner. A first and second processing unit groups G1 and G2 are arranged in the front of the system (i.e., in the lower part of FIG. 10). A third processing unit group G3 is arranged adjacent to the cassette station 110. A fourth processing unit group G4 is put adjacent to the interface section 114. A fifth processing group G5 is arranged at the back of the system.

Figure 11:
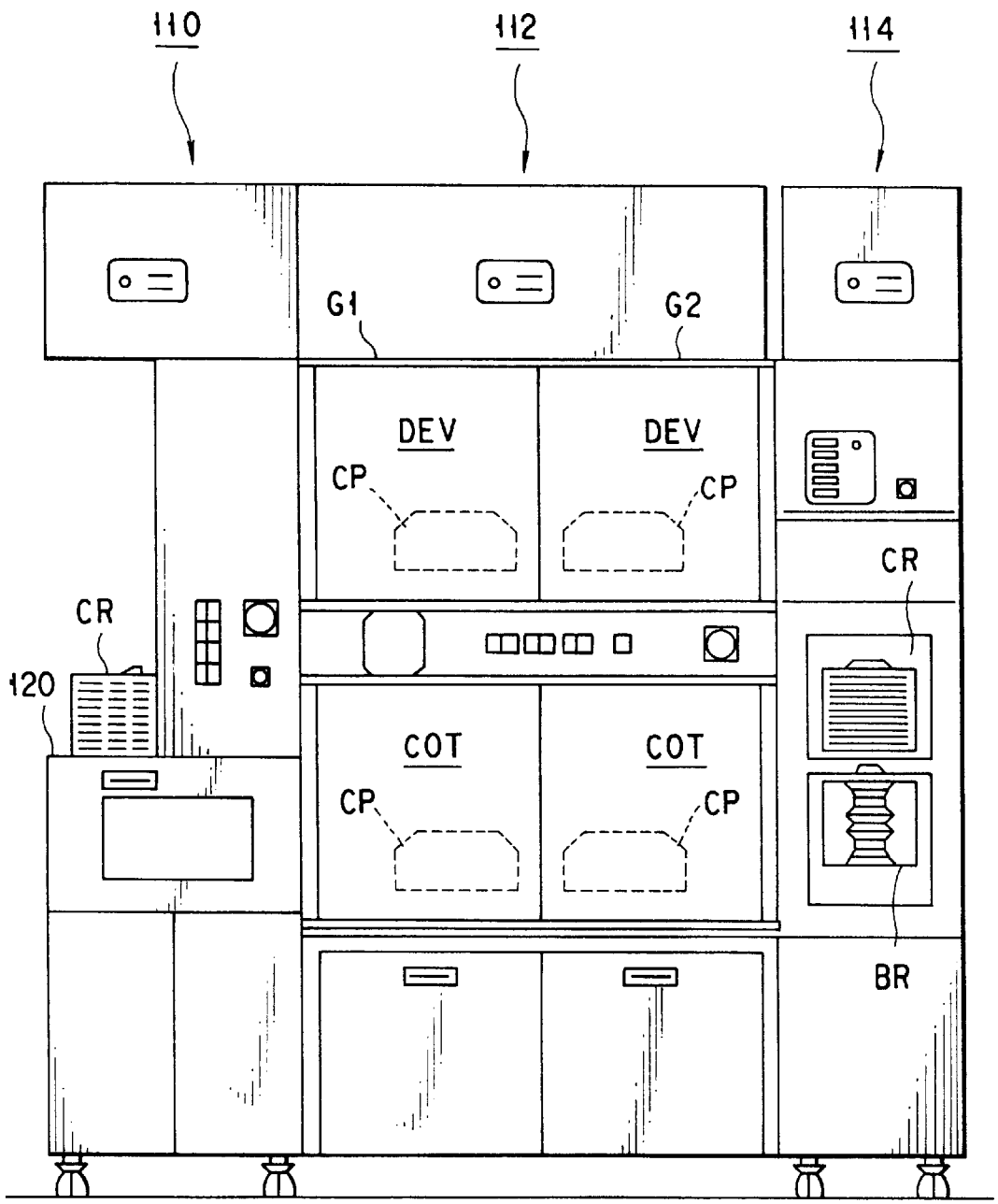
FIG. 11 is a front view of the coating/development system including a resist coating system according to the present invention.

As shown in FIG. 11, in the first processing unit group G1, two spinner-type processing units are arranged one on top of the other. They perform specific processes on the semiconductor wafer W on a spin chuck in a cup CP. For example, they are a photoresist coating unit (COT) and a developing unit (DEV) laid one on top of the other in that order from the bottom. Similarly, in the second processing machine group G2, a photoresist coating unit (COT) and a developing unit (DEV) laid one on top of the other in that order from the bottom. It is desirable that the photoresist coating unit (COT) should be placed at the lower stage, since the discharging of the photoresist solution is a difficult problem in terms of structure and maintenance. The photoresist coating unit (COT) may be placed at the upper stage, if necessary.

Figure 12:
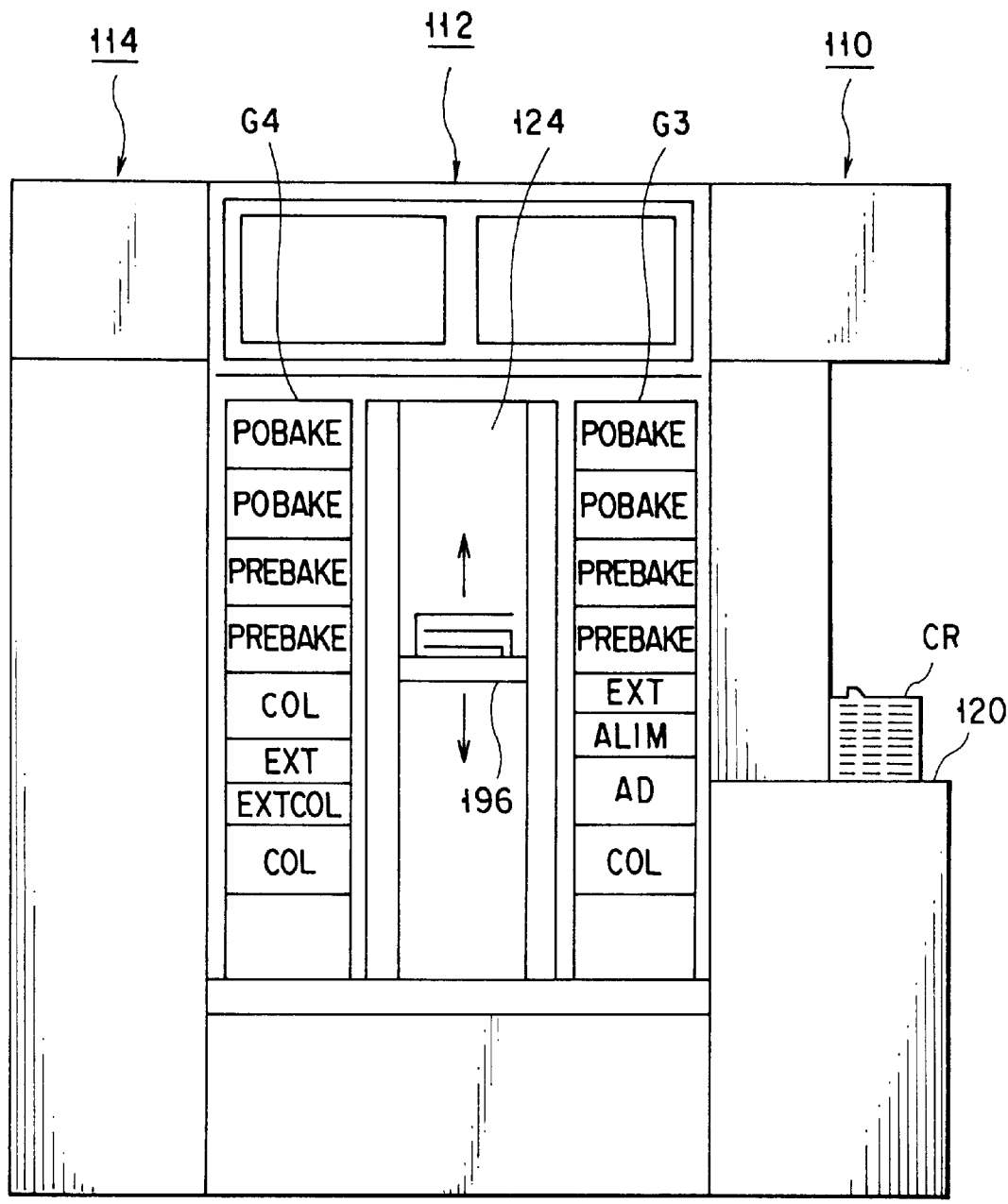
FIG. 12 is a rear view of the coating/development system including a resist coating system according to the present invention.

In the third processing unit group G3, open-type processing units are laid one on top of another in eight stages as shown in FIG. 12. These units perform specific processes on the wafer W on a table SP.

For example, in the third processing unit group G3, a cooling unit (COL), an adhesion processing unit (AD), an alignment machine (ALIM), an extension unit (EXT), two pre-baking units (PREBAKE), and two post-baking units (POBAKE) are laid one on top of another in that order from the bottom. Similarly, in the fourth processing unit group G4, open-type processing units are laid one on top of another in eight stages. For example, in the fourth processing unit group G4, a cooling unit (COL), an extension/cooling unit (EXTCOL), an extension unit (EXT), a cooling unit (COL), two pre-baking units (PREBAKE), and two post-baking units (POBAKE) are laid one on top of another in that order from the bottom.

Thermal interference between the units can be reduced by arranging the cooling unit (COL) and the extension/cooling unit (EXTCOL), whose processing temperatures are low, at the lower stages and the pre-baking units (PREBAKE), post-baking units (POBAKE), and adhesion processing unit (AD), whose processing temperatures are high, at the upper stages.

The interface section 14 has the same length in the direction of depth as that of the processing station 12 but is shorter in the direction of width. In the front of the interface section 14, a portable pickup cassette CR and a fixed buffer cassette BR are laid one on top of the other. A peripheral exposure unit 128 is provided at the back of the interface section. In the middle of the interface section, there is provided a wafer transfer machine 26. The wafer transfer machine 126 moves in the directions of X and Y to access both cassettes CR and BR and the peripheral exposure unit 128.

The wafer transfer machine 126 is also designed to turn in the direction of θ and access not only the extension unit (EXT) belonging to the fourth processing unit group G4 in the processing station 12 but also a wafer delivery table (not shown) on the adjacent exposure unit.

In the coating/development system constructed as described above, a semiconductor wafer W is transferred sequentially as follows for the respective processes.

First, the wafer transfer machine 122 unloads the unprocessed semiconductor wafers W one by one from the wafer cassette CR and loads it into the alignment unit (ALIM). The main wafer transfer machine 124 unloads the semiconductor wafer W positioned by the alignment unit and loads it into the adhesion processing unit (AD), which performs an adhesion process on the wafer W. After the adhesion process, the main wafer transfer machine 124 unloads the semiconductor wafer W and transfers it to the cooling unit (COL), which cools it. Thereafter, the semiconductor wafer W is transported via the resist coating unit (COT), pre-baking unit (PREBAKE), extension/cooling unit (EXTCOL), and interface section 144 to the exposure unit. Then the wafer is conveyed to the extension unit (EXT), developing unit (DEV), and post-baking unit (POBAKE) in the fourth processing unit group G4 and the extension unit (EXT) in the third processing unit group G3 for the respective processes. Then, the processed semiconductor wafer W is stored in the wafer cassette CR.

Figure 13:
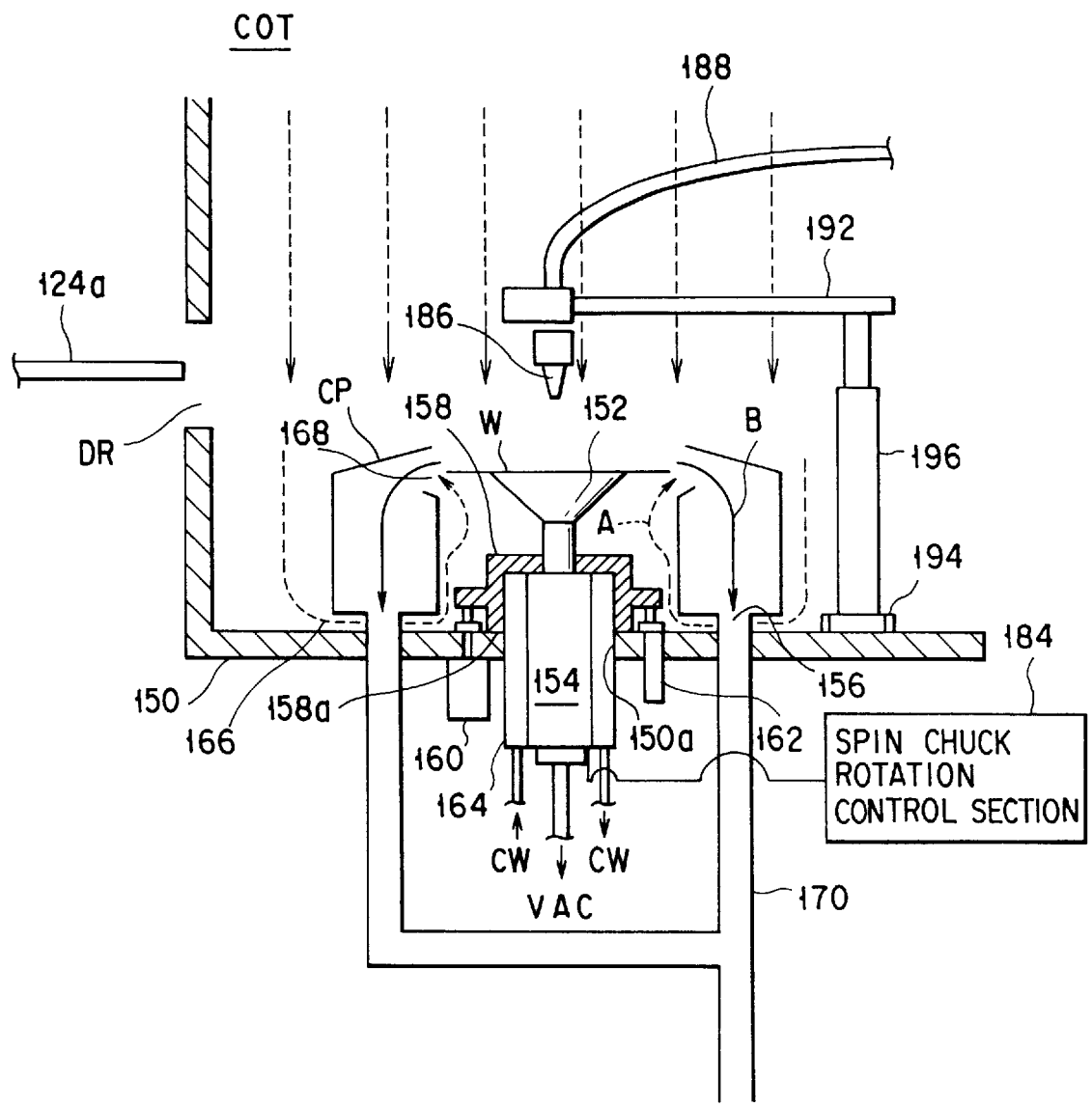
FIG. 13 is a sectional view, partly schematic, of a resist coating unit (COT)

Using FIG. 13, the resist coating unit (COT) of the embodiment will be explained. It is assumed that the resist coating unit (COT) forms a chemically amplified resist film on a wafer W.

In the resist coating unit (COT), an annular cup CP is provided in the central portion of the unit's bottom. Inside the cap, a spin chuck 152 is provided. The spin chuck 152 is designed to be rotated by a driving motor 154 under control of a spin chuck rotation control section 184, while securing the semiconductor wafer W in place by vacuum adhesion. The driving motor 154 is provided at an opening 150a made in a unit bottom board 150 so that it can move up and down. The driving motor is connected to an up-and-down driving unit 160 composed of, for example, an air cylinder, and an up-and-guide guide unit 162 via a cap-like flange member 158 made of, for example, aluminum. On the side of the driving motor 154, a tubular cooling jacket 164 made of, for example, SUS (stainless steel), is provided. The flange member 158 is provided so as to cover the upper half of the cooling jacket 164.

At the time of resist coating, the bottom end 158a of the flange member 158 comes into close contact with the unit bottom board 150 near the periphery of the opening 150a, thereby sealing the inside of the unit. When a semiconductor wafer W is given and received between the spin chuck 152 and the tweezers 124a of the main wafer transport mechanism, the bottom end of the flange member 158 rises from the unit bottom board 150 because the up-and-down driving unit moves the section including the driving motor 154 and the spin chuck 152 upward.

Figure 14:
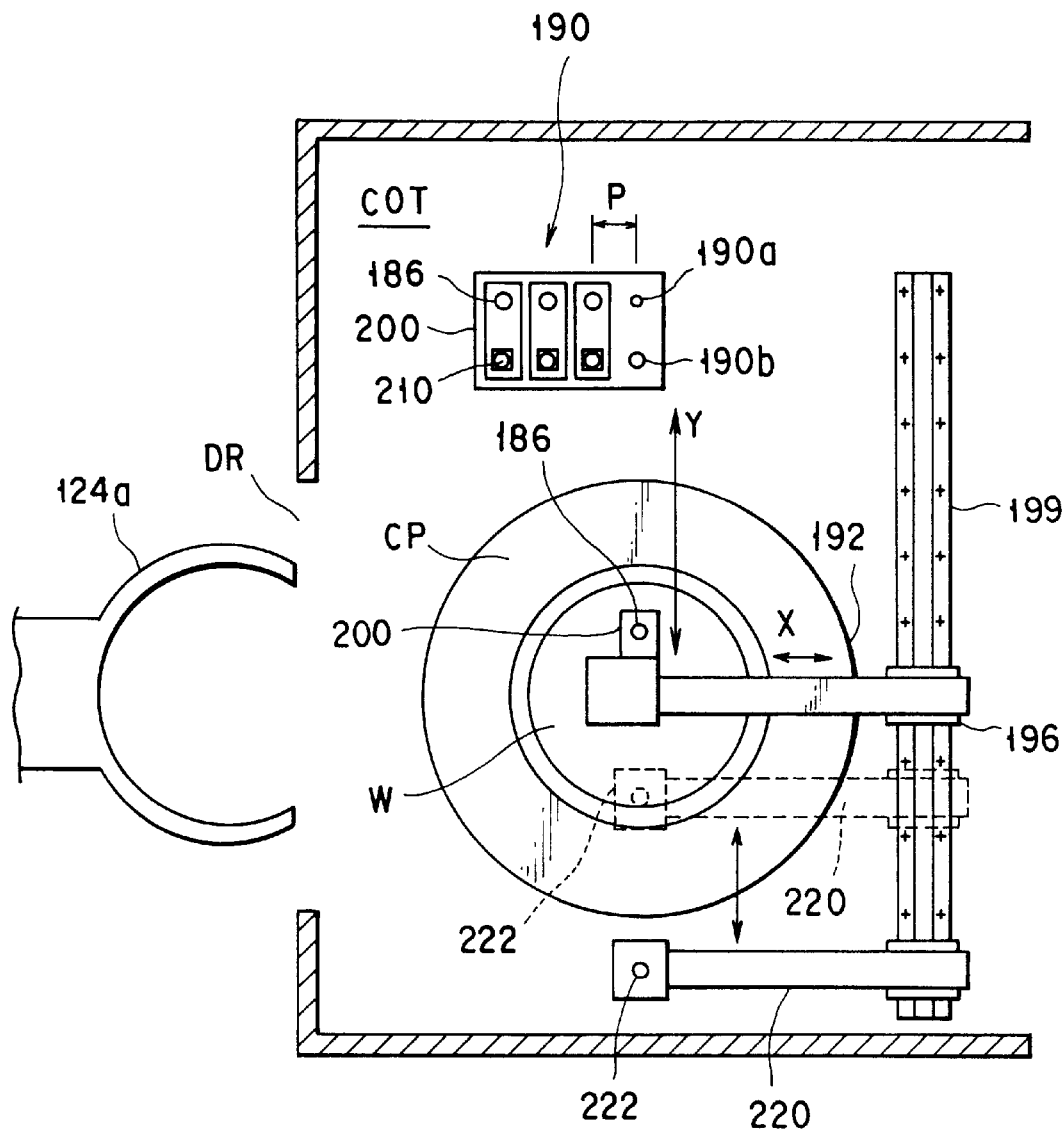
FIG. 14 is a plan view of the resist coating unit.

In FIG. 14, a resist nozzle 186 for supplying a resist solution to the surface of the semiconductor wafer W is connected via a supply pipe 188 to a resist supply section (not shown). The resist nozzle 186 is provided at the tip of a nozzle scanning arm 192 in a nozzle standby unit 200 on the outside of the cup CP in such a manner that the nozzle can be installed and removed. The nozzle is designed to be transported to a specific solution supply position in the upper part of the spin chuck 152. The resist nozzle scanning arm 192 is provided on the top end of a vertical support member 196 that can move horizontally over a guide rail 194 laid in one direction (in the direction Y) on the unit bottom board 150. The scanning arm is driven by a Y-direction driving mechanism (not shown) in such a manner that the arm, together with the vertical support member 196, moves in the direction X. The resist nozzle scanning arm 192 can also be moved by an X-direction driving mechanism (not shown) in the direction X perpendicular to the direction Y in order to selectively be fitted with the resist nozzle 186 at the resist nozzle standby unit 190.

In resist coating in the resist coating unit (COT), the resist nozzle scanning arm 192 moves in the direction X to the position corresponding to the resist nozzle 186 to be used. It then moves in the direction Y, or upward in the figure, and is fitted with the resist nozzle 186 to be used. After being fitted with a compatible resist nozzle 186, the resist nozzle scanning arm 192 moves in the direction Y, or downward in the figure, to a suitable position above the waver W and near its wafer's center. The wafer W is being turned by a motor (not shown). The resist nozzle remaining still in the above position first drips a thinner on the turning wafer W. The thinner is used to make a resist material easily stick to the surface of the wafer W.

The thinner dripped on the surface of the wafer W instantaneously spreads radially toward the outside by centrifugal force in such a manner that it covers the entire surface of the wafer W. Excess thinner is forced to fly toward the outside of the wafer W by centrifugal force and is collected into the cup CP.

Then, the resist nozzle 186 drips the resist solution on the surface of the wafer W. The dripped resist solution instantaneously spreads radially toward the outside of the wafer W by centrifugal force in such a manner that it covers the entire surface of the wafer W. Excess resist solution is forced to fly toward the outside of the wafer W by centrifugal force and is collected into the cup CP. The resist solution covering the surface of the wafer is instantly dried by a current of air induced by the rotation of the wafer and an air flow for drying.

After the dripping of the resist solution has been completed, the resist nozzle scanning arm 192 moves in the direction Y, or upward in the figure, and returns to the resist nozzle standby unit 190.

At the same time, a rinse nozzle scanning arm 220 moves in the direction Y, or upward in the figure, and stops right above the periphery of the wafer W. The rinse nozzle scanning arm 220 is used to remove the thick resist film formed at the periphery of the wafer W. A rinse nozzle 222 is attached to the tip of the rinse nozzle scanning arm 220. The rinse nozzle 222 supplies a thinner. The thinner supplied from the rinse nozzle 222 dissolves and removes the thick resist film formed at the periphery of the wafer.

After the thinner coating, resist coating, and rinsing processes, the formation process has been completed.

After the completion of the formation process, the wafer W on whose surface the resist film has been formed is conveyed to the interface section and held in the wafer cassette CR. When the number of resist-film-formed wafers W stored in the wafer cassette has reached a specific number, for example, 25, the wafer cassette CR holding the resist-film-formed wafers W is transferred to the film thickness measuring instrument, which measures the film thickness.

The thickness of the chemically amplified resist film varies as time passes since the formation of the resist film. Therefore, if the time from when the resist film is formed on the wafer W until the film thickness is measured is long, the value of the film thickness measured at the film thickness measuring instrument will be inaccurate. Particularly when the wafer cassette CR is transferred and the film thickness is measured on a lot basis, there will be a significant difference in measurements between the film thickness of the first wafer W and that of the last wafer.

To overcome this problem, the present embodiment corrects the value of film thickness by the following method.

Figure 15A:
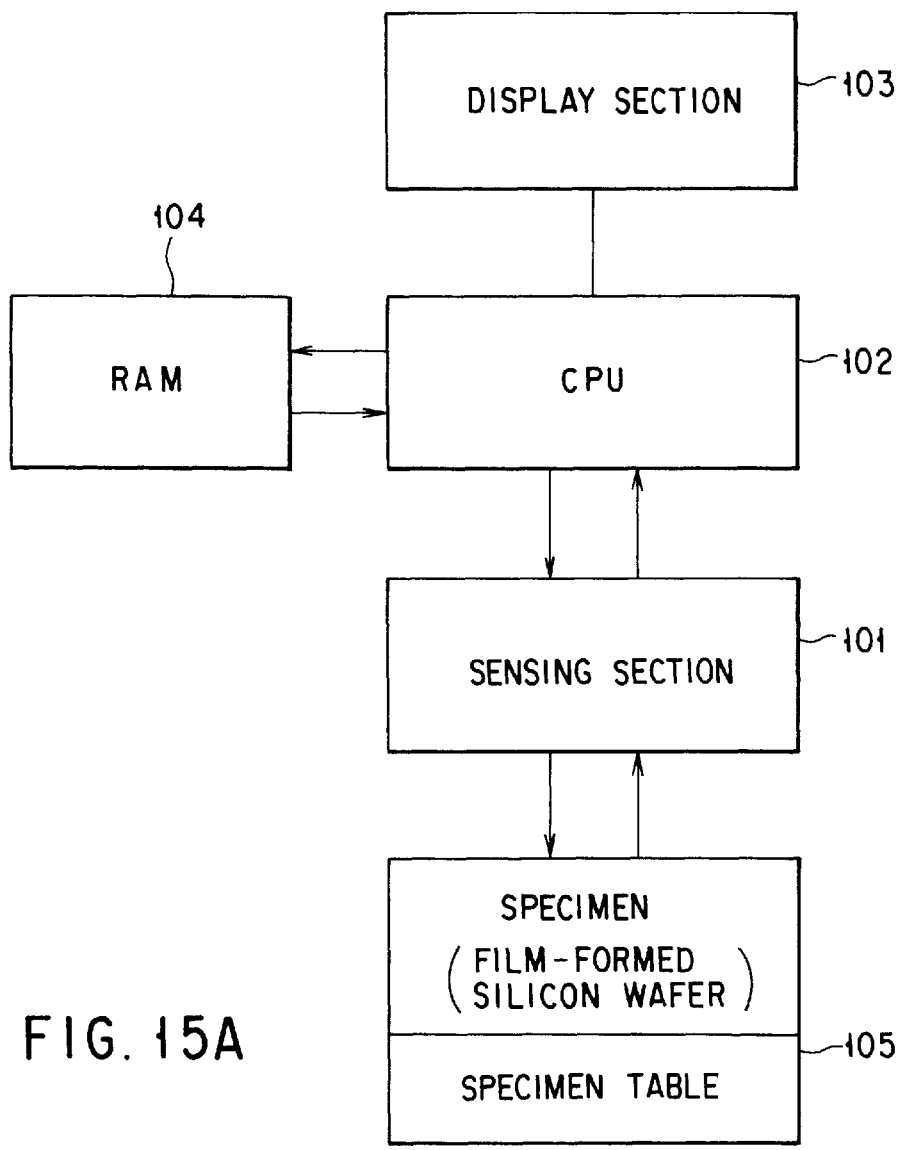
FIG. 15A schematically shows the configuration of a film thickness measuring unit used in implementing a resist film evaluation method according to the present invention.

FIG. 15A schematically shows the configuration of a film thickness instrument to which the method has been applied.

As shown in FIG. 15A, the film thickness instrument comprises a sensing section 101, a CPU 102, a display section 103, and a storage device 104. A specimen whose film thickness is to be measured (a resist-film-formed wafer W) is fixed to a specimen table 105 provided near the sensing section 101.

Figure 15B:
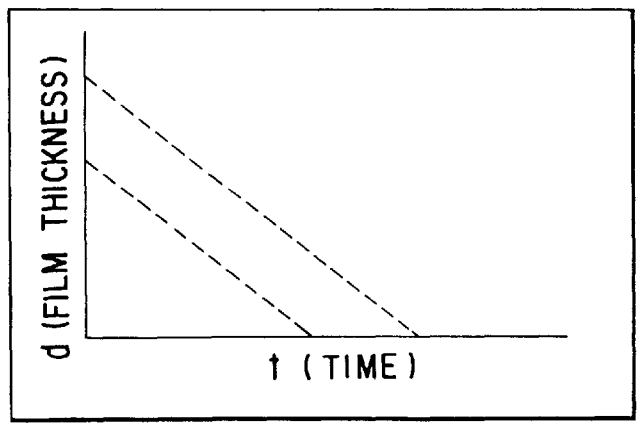
FIG. 15B shows information stored in RAM shown in FIG. 15A.

The sensing section 101 illuminates the specimen and senses the reflected light. The CPU 102 gives instructions to the sensing section 101, calculates the film thickness on the basis of the signal from the sensing section 101, writes and reads data into and from the storage device, e.g., RAM 104, corrects the value of the film thickness, and gives instructions to the display section 103. The display section 103 displays various parameters and data items, including the results of measuring the film thickness and the conditions for measurement. The storage device 104 stores data on the variation of the thickness of the chemically amplified resist film formed on the wafer W with respect to the elapsed time as shown in FIG. 15B.

The thickness of the resist film is measured on the following principle.

Figure 16:
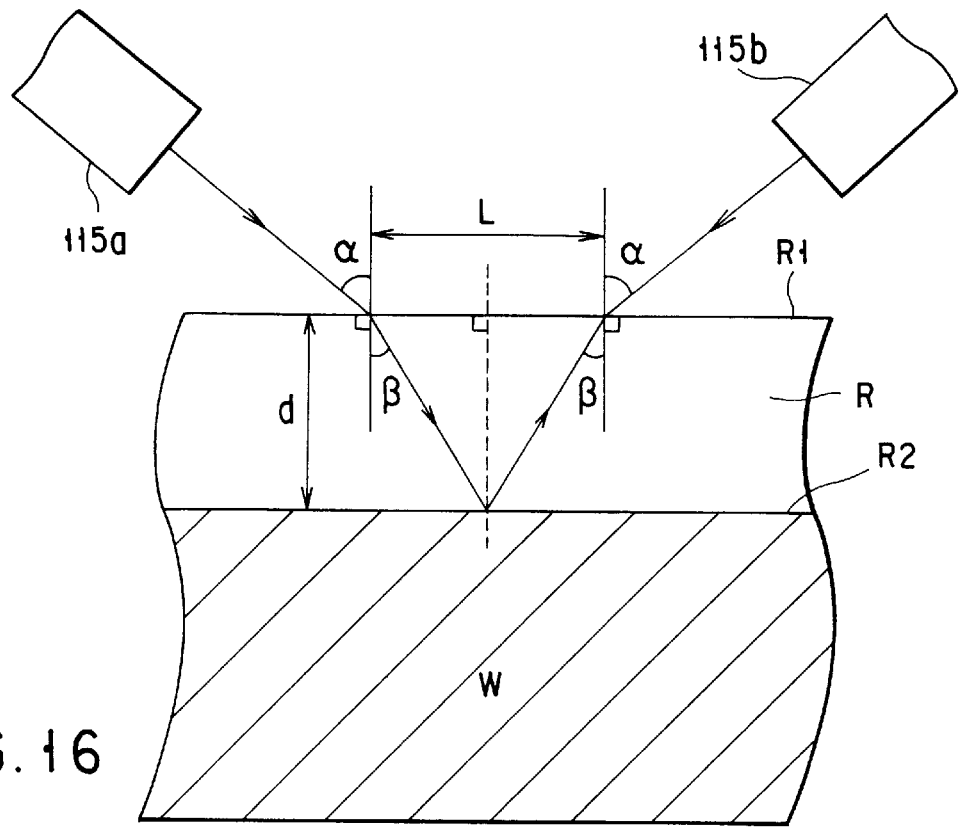
FIG. 16 is an enlarged view of a cross section of a wafer W coated with resist.

As shown in FIG. 16, when light is emitted from a light-emitting section 115a of a sensor 115, the light goes into the resist film R at an incidence angle of a from the surface of the wafer W. When the light goes from air into the resist film R, the light is refracted at the interface R1. If the refraction angle is β and the refractive index of the resist film is n, the following equation will hold between the incidence angle α, the refraction angle β, and the refractive index n:

$n = \sin \alpha / \sin \beta$

After entering the resist film, the light goes straight on inside the resist film and is reflected at the interface R2 with the wafer W. The reflected light advances within the resist film R toward the interface R1. When passing through the interface R1, the light is refracted again and travels at an incidence angle of a in the air and caught by a light-receiving section 115b of the sensor 115.

FIG. 16 shows the path by which the light emitted from the light-emitting section 115a of the sensor 115 passes through the resist film R, is reflected at the interface R2, travels again in the air, and is caught by the light-receiving section 115b of the sensor 115. As shown in FIG. 16, the path is symmetrical with respect to a normal represented by a broken line. As seen from FIG. 16, the film thickness d of the resist film R is given by the following equation:

$d = \frac{1}{2} \tan \beta$

Since $n = \sin \alpha / \sin \beta$, the value of d is given by:

$d = \sin \alpha / 2(n^2 - \sin^2 \alpha)^{1/2}$

Because the values of α and n are known, if the value of 1 is sensed by the sensor 115, the value of the film thickness d can be determined.

The reason why the thickness of the chemically amplified resist film varies as time elapses since the formation of the resist film is partly due to the variation of the refractive index n of the resist film R with the elapsed time since the formation of the resist, taking into account the fact that the film thickness d is calculated on the above-described principle.

The data stored in the storage device 104 are acquired as follows.

One or several wafers W are used as test specimens. Using the resist coating unit, a resist film is formed on the wafer under the same conditions as those for the products. The film thickness is measured with the film thickness instrument each time a specific time has elapsed. On the basis of the result of the measurement, data on the variation of the chemically amplified resist film formed on the wafer with respect to the elapsed time is acquired.

Figure 18:
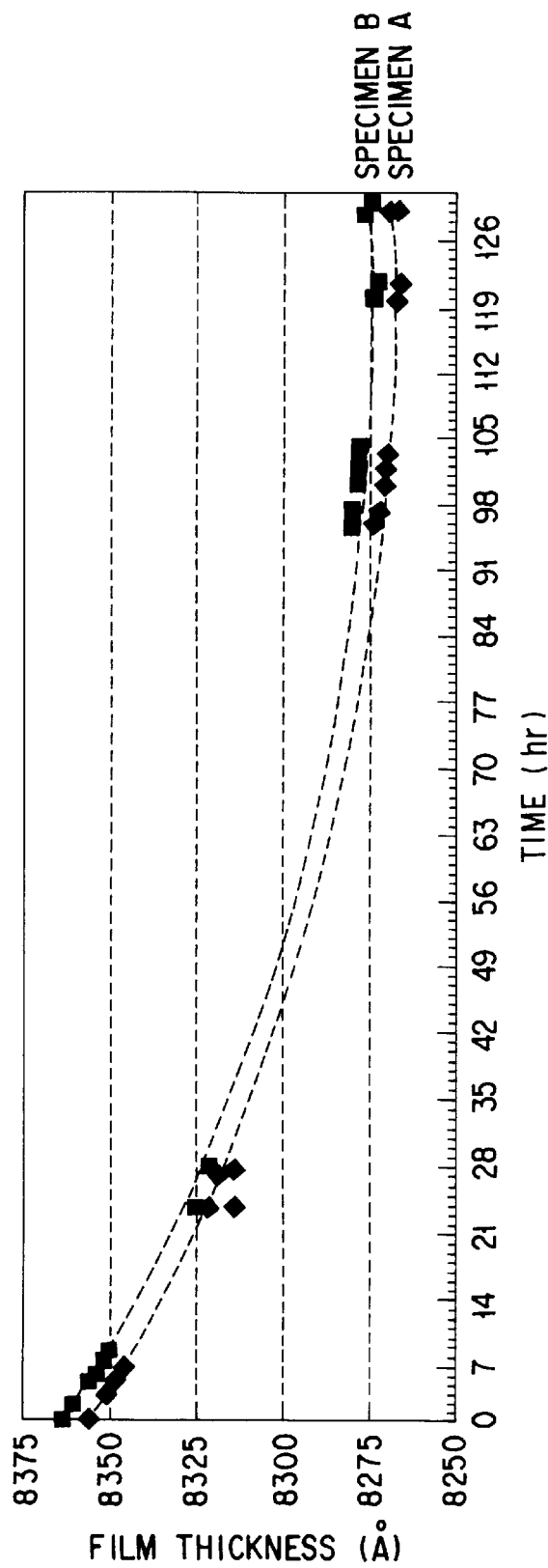
FIG. 18 shows curves for the relationship between the values of film thicknesses and the elapsed times.
Figure 19:
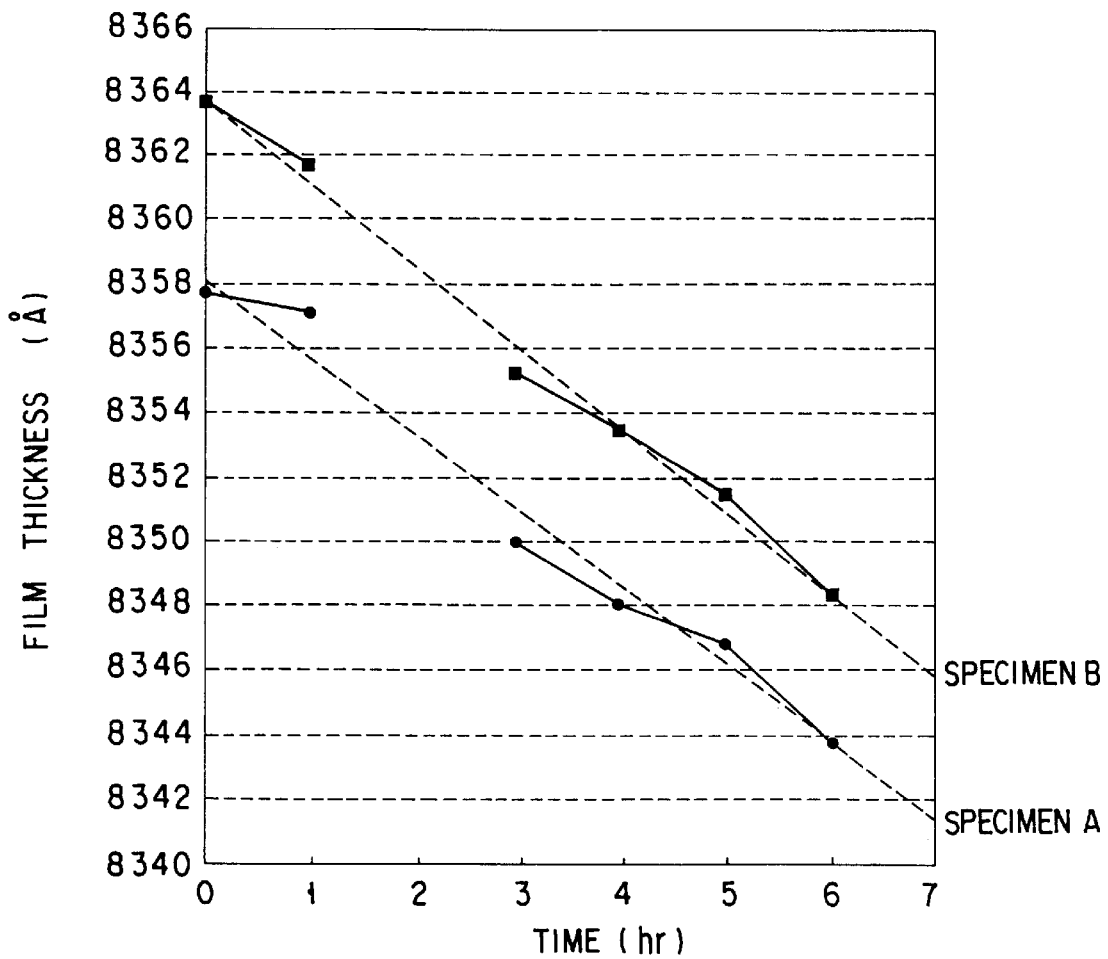
FIG. 19 shows curves for the relationship between the values of film thicknesses and the elapsed times.

FIG. 18 shows the relationship between the values of film thicknesses thus acquired and the elapsed times. FIG. 19 is an enlarged view of the portion ranging from 0 to 7 hours in FIG. 18. The black points in FIG. 19 represent the data obtained by actually measuring the film thicknesses. The dotted lines in FIG. 19 show the curves approximating the actual measurements. A least square approximation method may be used for approximation.

Figure 17:
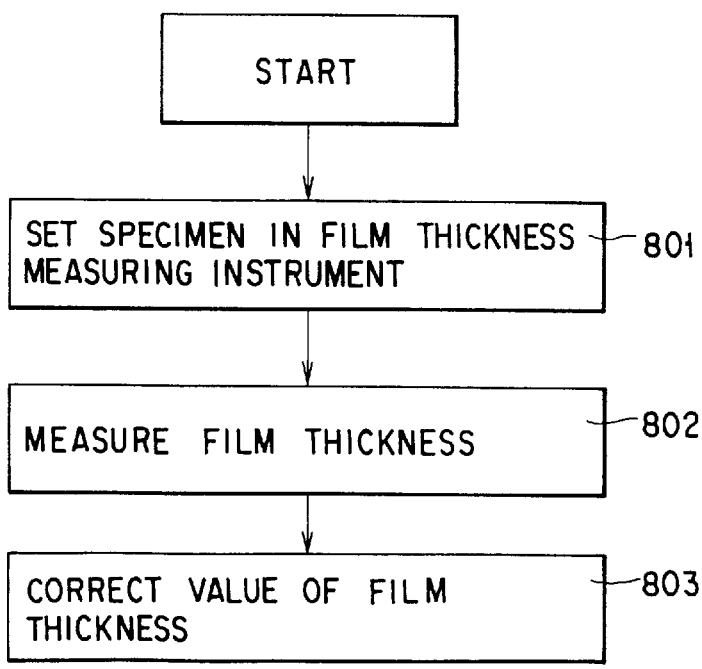
FIG. 17 is a flowchart of the procedure for effecting the film thickness evaluation method of the present invention.

A method of evaluating the film thickness with the instrument will be explained by reference to FIG. 17.

A wafer cassette containing 25 resist-film-formed wafers W is transferred from the coating/development system to the film thickness measuring instrument.

Then, the wafers W are taken out of the wafer cassette CR one by one. The wafer W is then set in the film thickness measuring instrument (step 801), which measures the film thickness (step 802).

The value of the film thickness varying with time (hereinafter, referred to the value of the film thickness as the variation) is calculated on the basis of the film thickness measurements and the elapsed times. Then, an accurate film thickness is computed by subtracting the variation from the film thickness measurement or adding the variation to the film thickness measurement (step 803).

With the embodiment, the value of the thickness of the chemically amplified resist formed on the substrate is corrected on the basis of data on the variation of the thickness of the resist film with respect to the elapsed time. This enables the value of the film thickness to be evaluated accurately, irrespective of the elapsed time.

Hereinafter, another embodiment of the present invention will be explained.

The present embodiment has a similar configuration to that of the first embodiment except that the film thickness measuring instrument is incorporated into the coating/development system and that an alarm device is provided which determines the permitted range of film thickness on the basis of data beforehand, determines whether or not the value of the film thickness corrected on data has exceeded the range, and gives an alarm when the value has exceeded the range. In the present embodiment, the film thickness measuring instrument is provided near the peripheral exposure unit 128. The resist-film-formed wafers are housed in a buffer cassette BR. The wafer transfer machine 126 takes out the wafers one by one from the buffer cassette BR and sets the wafer on the specimen table in the film thickness instrument, which measures the thickness of the resist film on the wafer.

As in the first embodiment, in the present embodiment, the film thickness is measured at a later time as the ordinal number of the wafer increases like the first wafer, the second wafer, . . . , the twenty-fifth wafer, which makes the variation larger. To overcome this problem, an accurate value of the film thickness is determined by correcting the measured film thickness on the basis of data on the result of the preliminary test measurement.

Furthermore, in the present embodiment, the permitted range of the values of film thicknesses after correction is limited on the basis of data on the variation of the thickness of the chemically amplified resist film with respect to the elapsed time. It is determined whether or not the value of the film thickness after correction has exceeded the range. If it has exceeded the range, the alarm device will produce an alarm. This enables the operator to know the occurrence of an abnormality quickly, when an abnormality has occurred in the resist-film forming process and the film thickness has exceeded the permitted range.

While in the embodiment, explanation has been given using the case of applying a chemically amplified resist to a wafer, the present invention is applicable to other substrates, such as LCDs.

As described above, with the film thickness evaluation method, the value of the thickness of the chemically amplified resist film formed on a substrate is corrected on the basis on data on the variation of the thickness of the same resist film with respect to the elapsed time. This makes it possible to grasp an accurate value of the film thickness, irrespective of the elapsed time.

Furthermore, it is determined whether or not the film thickness corrected on the basis of data on the variation of the thickness of the chemically amplified resist film formed on a substrate with respect to the elapsed time has exceeded a permitted range previously determined on the basis of data. If the corrected film thickness has exceeded the permitted range, the alarm device will produce an alarm, which enables the operator to know the occurrence of an abnormality in the formed resist film promptly and accurately.

Moreover, the thickness of the chemically amplified resist film formed on a substrate is measured. On the basis of the value of the film thickness measured, data used for correction is compensated for. This makes it possible to grasp the value of the film thickness more accurately, regardless of the elapsed time.

Providing the evaluation unit in the processing system makes it possible to grasp the value of the film thickness more quickly and accurately and prevent particles from sticking to the substrate.

Since whether or not the film thickness is within the permitted range has been determined, this enables the operator to know the occurrence of an abnormality in the formed resist film accurately and promptly and prevents particles from sticking to the substrate.

Because there is provided means for compensating for the stored data on the basis of the measured film thickness, this enables the data to be compensated for on time and prevents particles from sticking to the substrate.

If the resist film is measured as described above, the thickness of the resist film can be adjusted by controlling the rotation speed of the spin chuck 152 by means of the spin chuck rotation control section 184 in accordance with the measured film thickness as in the embodiment shown in FIG. 2.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A resist processing method in a resist processing system, comprising:

a first step of setting a substrate at a specific temperature;

a second step of forming a resist film on said substrate by applying a resist solution onto said substrate while turning said substrate set at the specific temperature;

a third step of heating said substrate on which said resist film has been formed;

a fourth step of cooling said heated substrate to a specific temperature; and a step of measuring the thickness of said resist film on said substrate between said third step and said fourth step in the resist processing system.

2. A resist processing method according to claim 1, further comprising the step of adjusting, on the basis of the result of measuring the thickness of said resist film, the humidity in a resist coating unit of said resist processing system, the rotational speed of said substrate in the resist coating unit, and at least one of the temperature of said substrate and the temperature of said resist solution in the first step.

3. A resist processing method according to claim 2, wherein said adjusting step is performed when the measured thickness of said resist film is larger than the upper limit of a permitted range in a first place on said substrate and is smaller than the lower limit of the permitted range in a second place on said substrate.

4. A resist processing method according to claim 2, wherein said film thickness measuring step is performed while a transfer mechanism in said resist processing system is holding said substrate in place.

5. A resist processing method according to claim 2, wherein said film thickness measuring step is performed on a test substrate provided in said resist processing system.

6. A resist processing method according to claim 1, wherein said film thickness measuring step is performed while the transfer mechanism in said resist processing system is holding said substrate in place.

7. A resist processing method according to claim 1, wherein said film thickness measuring step is performed on a test substrate provided in said resist processing system.

8. A resist processing method in a resist processing system, comprising:

a first step of heating a substrate to a first temperature;

a second step of forming a resist film on said substrate by applying a resist solution onto said substrate while turning said substrate set at the first temperature;

a third step of heating said substrate on which said resist film has been formed;

a fourth step of cooling said heated substrate to a second temperature; and a step of measuring the thickness of said resist film on said substrate after said fourth step in the resist processing system.

9. A resist processing method according to claim 8, further comprising the step of adjusting, on the basis of the result of measuring the thickness of said resist film, the humidity in a resist coating unit of said resist processing system, the rotational speed of said substrate in the resist coating unit, and at least one of the first temperature of said substrate and the temperature of said resist solution in the first step.

10. A resist processing method according to claim 9, wherein said adjusting step is performed when the measured thickness of said resist film is larger than the upper limit of a permitted range in a first place on said substrate and is smaller than the lower limit of the permitted range in a second place on said substrate.

11. A resist processing method according to claim 8, wherein said film thickness measuring step is performed while a transfer mechanism in said resist processing system is holding said substrate in place.

12. A resist processing method according to claim 8, wherein said film thickness measuring step is performed on a test substrate provided in said resist processing system.

13. A resist processing method according to claim 12, further comprising the step of washing out, in the resist coating unit, the resist film on the test substrate whose film thickness has been measured, to reuse it.

14. A resist processing system comprising:
- a resist coating unit for forming a resist film on a substrate by applying a resist solution onto the substrate while turning the substrate;
- a heating unit for heating said substrate;
- a transfer mechanism for holding and transferring said substrate; and
- a film thickness measuring instrument provided above a load/unload slot of said heating unit to measure the thickness of the resist film formed on said substrate.

15. A resist processing system comprising:
- a resist coating unit for forming a resist film on a substrate by applying a resist solution onto the substrate while turning the substrate;
- a heating unit for heating said substrate to a first temperature;
- a temperature adjusting unit having the function of cooling at least said substrate to a second temperature;
- a transfer mechanism for holding and transferring said substrate; and
- a film thickness measuring instrument which is provided above load/unload slots of at least either said heating unit or said temperature adjusting unit, said heating unit and said temperature adjusting unit being laid one on top of another, and which measures the thickness of the resist film formed on said substrate.

16. A resist processing system comprising:
- a resist coating unit for forming a resist film on a substrate by applying a resist solution onto the substrate while turning the substrate;
- a heating unit for heating said substrate to a first temperature
- a transfer mechanism for holding and transferring said substrate; and
- a film thickness measuring instrument provided above a transfer path of said transfer mechanism to measure the thickness of the resist film formed on said substrate.

17. A film thickness evaluation method comprising the steps of:
- storing data on the variation of the thickness of a chemically amplified resist film formed on a substrate with elapsed time;
- measuring the thickness of the chemically amplified resist film formed on said substrate; and
- correcting the value of said measured film thickness on the basis of said stored data.

18. A film thickness evaluation method according to claim 17, further comprising a step of giving an alarm when said corrected film thickness is outside a permitted range.

19. A film thickness evaluation method according to claim 17, further comprising a step of compensating for said stored data on the basis of the value of said measured film thickness.

20. A processing apparatus comprising:
- means for forming a chemically amplified resist film on a substrate;
- means for storing data on the variation of the thickness of the chemically amplified resist film formed on said substrate with elapsed time;
- means for measuring the thickness of the chemically amplified resist film formed on said substrate; and
- means for correcting the value of said measured film thickness on the basis of said stored data, wherein these means are integrated into a single structure.

21. A processing apparatus according to claim 20, further comprising means for determining whether or not said corrected film thickness is outside a predetermined permitted range and means for giving an alarm when said corrected film thickness is outside said permitted range.

22. A processing apparatus according to claim 20, further comprising means for compensating for said stored data on the basis of the value of said measured film thickness.

* * * * *